SEMICONDUCTOR DEVICES AND THEIR FABRICATION

Filed May 24, 1963 4 Sheets-Sheet 1

INVENTOR
WALTER E. MUTTER
BY Everett A. Gastrell
ATTORNEY

United States Patent Office 3,319,311
Patented May 16, 1967

3,319,311
SEMICONDUCTOR DEVICES AND THEIR FABRICATION

Walter E. Mutter, Poughkeepsie, N.Y., assignor to International Business Machines Corporation, New York, N.Y., a corporation of New York Filed May 24, 1963, Ser. No. 283,028
12 Claims. (Cl. 29—25.3)

The present invention is directed to semiconductor devices and their fabrication. More particularly, the invention relates to the fabrication of semiconductor diodes and transistors in a manner which inhibits the formation of undesired surface inversion layers, and to the improved devices resulting therefrom.

A problem which is often encountered in the fabrication of semiconductor devices is known as surface inversion. Surface inversion is an undesirable change in the conductivity of the semiconductor material from N-type to P-type, or vice versa, during various device processing procedures or as a result of ambient atmospheres. Such inversion normally occurs as a very thin region or layer on the surface of the semiconductor body. Inversion layers may arise from the entry of spurious donors or acceptors into the semiconductor body or as a result of induced charges from ions or trapped charges on or near the surface of the semiconductor body. Depending upon the polarity of the charges and the conductivity type of the semiconductor body, one may encounter in a semiconductor device either an inversion layer or an accumulation layer, the latter being, for example, the creation of a $P^+$ or more highly doped layer on a P-type semiconductor body. Inversion layers, however, are more troublesome than accumulation layers.

An inversion layer on a semiconductor device such as a planar diode or transistor impairs its electrical characteristics by increasing leakage currents, reducing beta, and adding undesirable capacitance. Passivated oxide coating of a material such as a silicon dioxide are employed in the fabrication of such devices and are believed to be a factor in the formation of an undesired surface layer. Special difficulty has been experienced with such layers in the manufacture of PNP planar transistors. Industry has endeavored without particular success to build a surface-passivated high-voltage silicon planar PNP transistor which has a low leakage current comparable with that associated with a planar NPN transistor. To increase breakdown voltage rating of such PNP transistors, a high-resistivity P-type collector layer has been epitaxially deposited on a low resistivity P-type collector region or substrate. Unfortunately, high-resistivity semiconductor regions are much more subject to inversion than are low-resistivity regions. Accordingly, the surface of the P-type epitaxial layer underwent inversion so that the thin N-type skin or channel which was formed thereon effectively became an extension of the base region. The channels present in individual devices of the same design were uncertain as to depth and apparent resistivity. Consequently, erratic performance and instability problems resulted. Also, since the N-type skin or channel constituted an unwanted extension of the base region of the planer transistor, the base-collector junction no longer came to the upper surface of the device. That junction appeared at the edges of the transistor where it was not protected by the passivating oxide.

One expedient which has been proposed to overcome some of the shortcomings occasioned by the presence of the undesired N-type conductivity channel mentioned above has been the use of a heavily doped diffused region of P-type conductivity which penetrated through a portion of the channel into the P-type epitaxial layer thereunder. This region presented a high-impedance discontinuity which terminated the channel and tended to interrupt the flow of leakage current therein. The geometry of that transistor was such that additional fabrication steps were required in its manufacture.

It is an object of the present invention, therefore, to provide a new and improved method of fabricating semiconductor devices which inhibits the formation of undesired surface inversion layers thereon.

It is another object of the invention to provide a new and improved method of fabricating planar semiconductor devices such that they are free from high leakage currents.

It is an additional object of the invention to provide a new and improved method of making semiconductor devices which are not subject to channels and yet have a high breakdown voltage characteristic.

It is a still further object of the present invention to provide a new and improved planar PNP transistor which lacks an undesired surface inversion layer, has a high collector breakdown voltage and a low collector-to-base capacitance.

It is yet another object of the invention to provide a new and improved planar semiconductor diode which is free from an unwanted surface inversion region.

It is also an object of the present invention to provide a new and improved method of making a planar PNP or NPN transistor which has electrical characteristics comparable to those of a planar NPN transistor.

In accordance with a particular form of the invention, the method of inhibiting the formation of an undesired surface inversion region in the fabrication of a semiconductor device comprises forming a low-resistivity body of semiconductor material of one conductivity type, and forming a high-resistivity layer of semiconductor material of the opposite conductivity type on a surface of that body. The method also includes introducing a conductivity-directing impurity of the aforesaid one type through at least one selected portion of the aforesaid layer into the body for converting the aforesaid at least one portion to the aforesaid one conductivity type and for producing on a surface region of the aforesaid at least one portion a concentration of the impurity sufficient to inhibit the inversion of the surface region to the other conductivity type.

Also in accordance with the invention, in the fabrication of a transistor having a low-resistivity semi-conductor body of one conductivity type, the method of inhibiting the formation of undesired surface inversion regions in the transistor comprises vapor depositing a high-resistivity layer of semiconductor material of the opposite conductivity type on a surface of the body. The method also includes diffusing a conductivity-directing impurity of the opposite one type through selected portions of the layer in the body and converting those portions to the one conductivity type and for producing on the surface region of each of the portions a concentration of that impurity sufficient to inhibit the inversion of the aforesaid surface region to the other impurity type, this diffusion leaving one portion of the layer which is of the opposite conductivity type. The method further includes diffusing into part of the aforesaid one portion a conductivity-directing impurity of the one type to form a transistor emitter region while the remaining of the one portion constitutes a transistor base region and the body and portions of that one conductivity type constitute a transistor collector region.

Further in accordance with the invention, an intermediate structure in the fabrication of the semiconductor device comprises a body of semiconductor material of one conductivity type and having a low resistivity, and a layer of high-resistivity semiconductor material of the opposite conductivity type contiguous with the body and defining a PN junction therewith. The structure further includes a region of the given conductivity type which extends through at least a selected portion of the layer and the portion of the body thereunder and which has on its surface an impurity concentration of that one type sufficient to inhibit inversion of that surface to semiconductor material of the opposite conductivity type.

The foregoing and other objects, features and advantages of the invention will be apparent from the following more particular description of the preferred embodiments of the invention, as illustrated in the accompanying drawings.

Figure 1A:
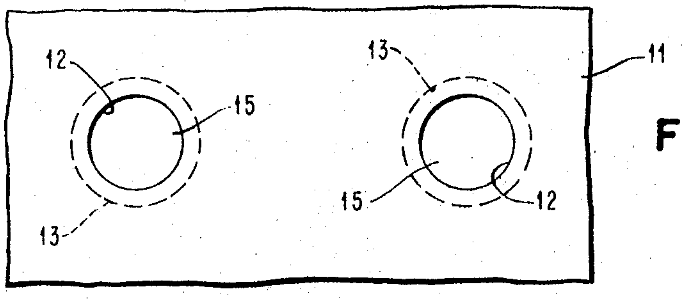
FIGS. 1A–1C are plan and sectional views of portions of a semiconductor diode structure in accordance with the prior art.
Figure 1B:
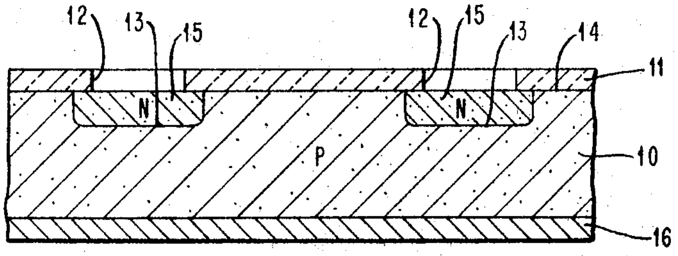
Figure 1C:
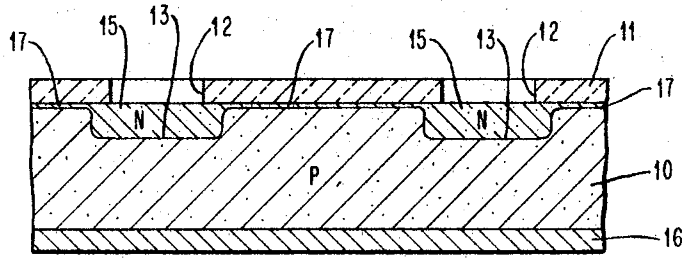
FIG. 1C PRIOR ART

*Description of prior-art structure of FIGS. 1A–1C*

In order more fully to understand the advantages of the methods and the semiconductor devices of the present invention, it is desirable to consider first the fabrication of a semiconductor diode in accordance with the prior art and the surface inversion problem encountered therewith. Referring now more particularly to FIGS. 1A–1C, there are represented portions of a pair of conventional semiconductor devices or diodes having a common semiconductor body 10. While but two diodes have been shown for convenience of representation and explanation, it will be understood that ordinarily a large array of several hundred diodes are fabricated simultaneously on a single semiconductor body of a suitable material such as germanium, silicon or an intermetallic semiconductor compound. For the purpose of this explanation and those which follow, it will be assumed that the various semiconductor bodies are of silicon. The body 10 has a continuous film 11 of an oxide coating formed thereon integral with its upper surface. While various oxide films may be employed, this film is preferably one of silicon dioxide. To that end, film 11 is a genetic layer formed from the parent body 10 by means other than simply exposing the body to the atmosphere. Film 11 may be derived from the body 10 by heating the latter to between 900–1400° C. in an oxidizing atmosphere saturated with water vapor or steam. Patent 2,802,706 to Derick et al., granted Aug. 14, 1957, and entitled, "Oxidizing of Semiconductor Surfaces for Controlled Diffusion," describes one such treatment. Although the exact chemical composition of the oxide film 11 is not known, it is believed that silicon dioxide is its major constituent.

Alternatively, an inert adherent coating or film which is believed to be mostly silicon dioxide may be formed on the surface of the semiconductor body 10 by heating the latter in the vapors of an organic siloxane compound at a temperature below the melting point of the body but above that at which the siloxane decomposes, so that an inert film of silicon dioxide coats the desired surface. For example, member 10 may be heated for 10–15 minutes at approximately 700° C. in a quartz furnace containing triethoxysilane, using argon or helium as the carrier gas to sweep the siloxane fumes through the furnace. Since experience has indicated that silicon dioxide films made by the thermal decomposition of an organic siloxane compound are somewhat less dense than those grown in an oxidizing atmosphere, a somewhat thicker film of the former is ordinarily employed. Such films are, however, particularly advantageous for application to materials such as germanium for the purposes under consideration. Patent 3,089,793 of Eugene L. Jordan and Daniel J. Donahue, granted May 14, 1963, and entitled "Semiconductor Devices and Methods of Making Them" describes procedures for making such films, removing selected portions thereof, and diffusing conductivity-directing impurities through the openings established in those films to form PN junctions.

Apertures 12, 12 are formed at predetermined locations in the film 11 by conventional photoengraving techniques. In a manner well known in the art, a photoengraving resist (not shown) is placed over the silicon dioxide film and the resist is then exposed through a master photographic plate having opaque areas corresponding to the regions from which the oxide film is to be removed. In the photographic development, the unexposed resist is removed and a corrosive fluid is employed to remove the oxide film from the now exposed regions while the developed resist serves as a mask to prevent the chemical etching of the oxide areas that are to remain on the silicon body 10.

In the next operation, a pair of PN junctions 13, 13 are created in the body 10, which junctions extend to the upper surface 14 of the body. This is accomplished by a conventional diffusion operation wherein a suitable conductivity-determining impurity passes through the apertures 12, 12 and diffuses into the body 10 to establish therein regions 15, 15 of a conductivity type opposite to that of the body and to create the junctions 13, 13. The elevated temperature of the diffusion operation does not damage the silicon dioxide film 11, which preferably has a thickness at least as great as 1000 Angstroms and may be in the range of 1000 to 30,000 Angstroms. Film 11 is impervious to the diffusing material and hence serves as a passivating and diffusion mask that confines the diffusion to predetermined areas on the surface of the body 10. It will be observed that in the diffusion operation, the impurity creeps or diffuses for a short distance under the edge portions of the silicon dioxide film 11 which defines the apertures 12, 12.

In subsequent operations, ohmic contacts in the form of conductive coatings (not shown) may be applied to the exposed surfaces of regions 15, 15 by well-known evaporation and alloying techniques and another ohmic contact made by soldering a conductive plate 16 to the bottom of the body 10. Alternatively, a procedure similar to that disclosed and claimed in the copending application of John A. Perri and Jacob Riseman, Ser. No. 248,530, filed Dec. 31, 1962, and entitled, "Method of Covering the Surfaces of Objects with Protective Glass Jackets and the Objects Produced Thereby," may be employed to reoxidize the exposed semiconductor regions 15, 15, deposit glass thereover, etch holes through the glass and the oxide films to expose again certain portions of the regions 15, 15 and then deposit terminals on those exposed portions and on portions of the glass.

For the purpose of the present consideration, it will be assumed that the structure of FIGS. 1A–1C is a high-speed switching diode and that the body 10 is of a P-type conductivity and has a typical resistivity of about 0.3 ohm-centimeter which corresponds to an acceptor level of about $5\times10^{16}$ atoms per cubic cm. If no inversion problems were encountered in the fabrication of the planar diode structure including the diffusion of the N-type impurity to form the regions 15, 15, there would result the multi-unit or dual diode structure of FIG. 1B. However, such a structure is not reliably attained in device manufacture. The structure which actually results resembles that represented in FIG. 1C, which includes an unwanted N-type surface inversion layer 17. This layer may occur in random patches or, if the surface inversion is severe, may constitute an extension of the N-type region 15 as represented by the inversion layer 17. This surface inversion phenomenon is not fully understood. However, its occurrence is particularly evident after the processing or fabrication of semi-conductor devices which include a lightly doped region such as the P-type body 10 of FIG. 1C. In addition to the surface passivation, etching and diffusion operations described above, it is believed that the application of ohmic contacts and glassing operations might also contribute to the occurrence of surface inversion. Abnormally high reverse leakage currents and also capacitance occur because the PN junction area 13 is now much larger than was intended. Moreover, the impurity gradient at the junction near the surface in the inversion layer or areas may be very high, thus producing a high capacitance per unit area. The completed devices therefore do not represent the quality devices which are desired for many applications. As previously mentioned, increasing the doping level of the P-type body 10 aids in reducing surface inversion and its related problems. However, this expedient decreases the reverse breakdown voltage of the diode and increases the capacitance per unit area of the junction. Thus, increasing the impurity concentration of the semiconductor body 10 is not an attractive or practical solution to the inversion problem, particularly in the fabrication of a high-speed semiconductor device. The undesired effects may be partially offset by diffusing deeper to form the PN junction. Unfortunately this increases the total junction area and hence the total capacitance. Experience has indicated that no practical design compromise is possible by the last-mentioned approach.

*Description of device structure of FIGS. 2A–2E*

Figure 2A:
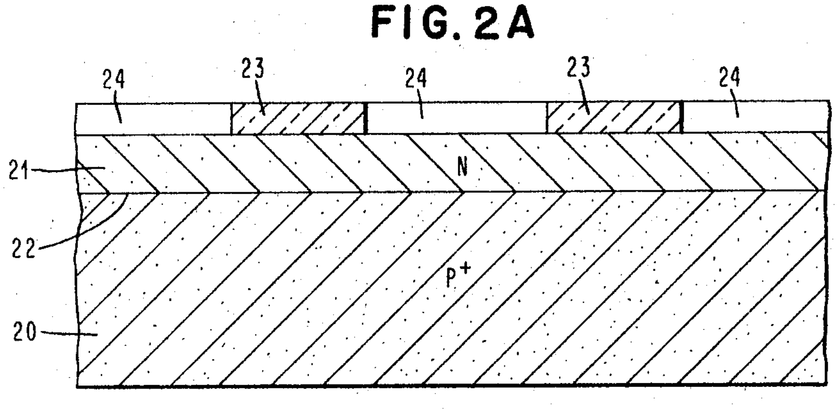
FIGS. 2A–2E are similar views of a semiconductor diode employed in explaining the method of the present invention.

Reference is now made to FIGS. 2A–2E which represent various stages in the fabrication of a semiconductor device that circumvents the problems considered above in connection with the prior-art structure of FIG. 1C. In FIG. 2A there is shown a low-resistivity body 20 of a suitable semiconductor material, such as silicon, of one conductivity type. Body 20 constitutes the usual starting wafer and, for the purposes of the description and explanation which follows, will be considered as being of the P conductivity type silicon. Its resistivity may be of a suitable value such as one in the range of 0.001–0.03 ohm-cm. It will be understood, however, that it may be of the opposite or N-type conductivity, in which case the additional semiconductor regions to be formed would be of an appropriate conductivity type to form a pair of semiconductor diodes. In accordance with conventional representation practices in the semiconductor art, body 20 will be represented in the drawing as being of $P^+$ material because of its low resistivity. While applicant does not wish to be limited thereto, a typical resistivity which has proved to be useful in a practical device for the body 20 is about 0.01 ohm-cm. Its thickness may be of the order of 5 mils.

Next there is vapor deposited on the body 20 by well-known epitaxial deposition techniques a high-resistivity layer 21 of semiconductor material of the opposite or N-type on a surface of the body. Layer 21 is relatively thin and may have a thickness of about 0.3 mil and a typical resistivity of about 0.3 ohm-cm. Resistivities in the range of 0.1–3 ohm-cm. are useful values. The contiguous body and layer define a PN junction 22.

In a succeeding operation, there is introduced, as by diffusing, a conductivity-directing impurity of the aforesaid one or P conductivity type through at least one selected portion of the layer 21 into the body 20 for converting that said at least one portion to the aforesaid one or P conductivity type and for producing on a surface region of that at least one portion a concentration of the impurity sufficient to inhibit inversion of that surface region to the other or N conductivity type. This will be made clear hereinafter. To accomplish this inversion-inhibiting function, a suitable apertured diffusion mask 23 is first formed on the upper surface of the epitaxial layer 21. This mask may be made in the manner previously explained in connection with the film 11 of FIGS. 1A–1C, and preferably comprises an adherent silicon dioxide coating having apertures 24, 24 formed therein in accordance with a predetermined pattern by conventional photoengraving techniques. Then a P-type conductivity-determining impurity such as boron is diffused in a conventional manner through the apertures in the mask 23. This is a high surface-concentration diffusion operation. As the P-type impurity diffuses inwardly from the exposed surfaces of the epitaxial layer 21 to the extent represented in FIG. 2B by the solid-line saucers 25, 25, it is believed that the P-type impurity in the heavily doped or $P^+$ body 20 diffuses outwardly from the dash-dot line region 26 which previously included the PN junction 22. This out-diffusion from the body 20 extends to the region represented by the broken line 27. The diffusion time and temperature are selected so that the two diffusions just described overlap everywhere except, of course, in the regions directly under the silicon dioxide mask 23 where partially submerged islands or zones 28, 28 of high-resistivity N-type semiconductor material remain.

Figure 2B:
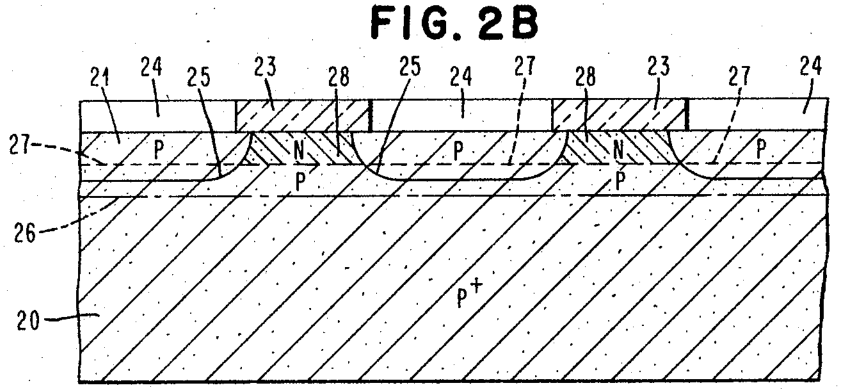
Figure 2C:
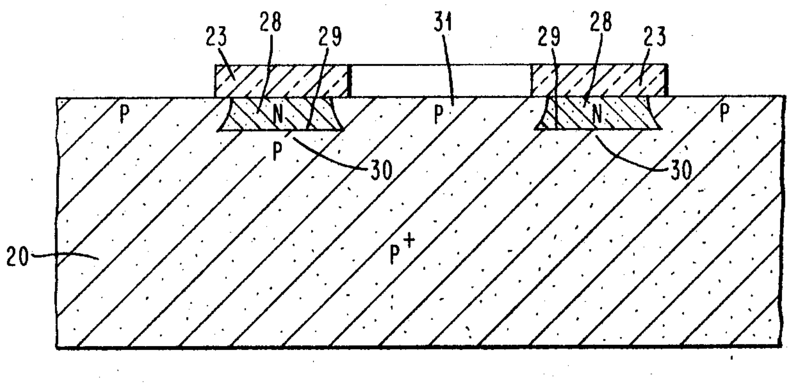

The resultant structure is represented in FIG. 2C, which is free from the construction lines of FIG. 2B that were employed in explaining the nature and extent of the various diffusions. There now has been established a pair of PN junctions 29, 29 between the high-resistivity N-type semiconductor zones 28, 28 and the adjacent P-type regions 30 and 31 which formerly were of the N conductivity type. The exposed upper surface of the semiconductor structure is now so strongly P-type that, for all practical purposes, it is impossible for inversion to occur.

A P-type impurity concentration which has proved to be useful about the regions of the junctions 29, 29 may be in the range of $10^{19}$–$5\times10^{20}$ atoms/cm.$^3$ However, experience has indicated that the higher concentrations are much more desirable. Since the N-type zones 28, 28 have a high resistivity, the breakdown voltage of the individual diodes is desirably highly. By using a higher resistivity epitaxial layer to establish the zones 28, 28, higher breakdown voltage ratings may be obtained for the devices. Also, since the main body portion of the structure is now very highly doped with acceptors, the forward voltage drop of the multi-unit device may be minimized without regard to whether a common connection is made to the top or to the bottom of the P-type bulk. As the diffusion time is increased in connection with the formation of the improved structure of FIG. 2C, for example, to reduce the capacitance per unit area, the actual diode junction area desirably becomes smaller rather than larger as contrasted with the conventional structure of FIG. 1C.

Figure 2D:
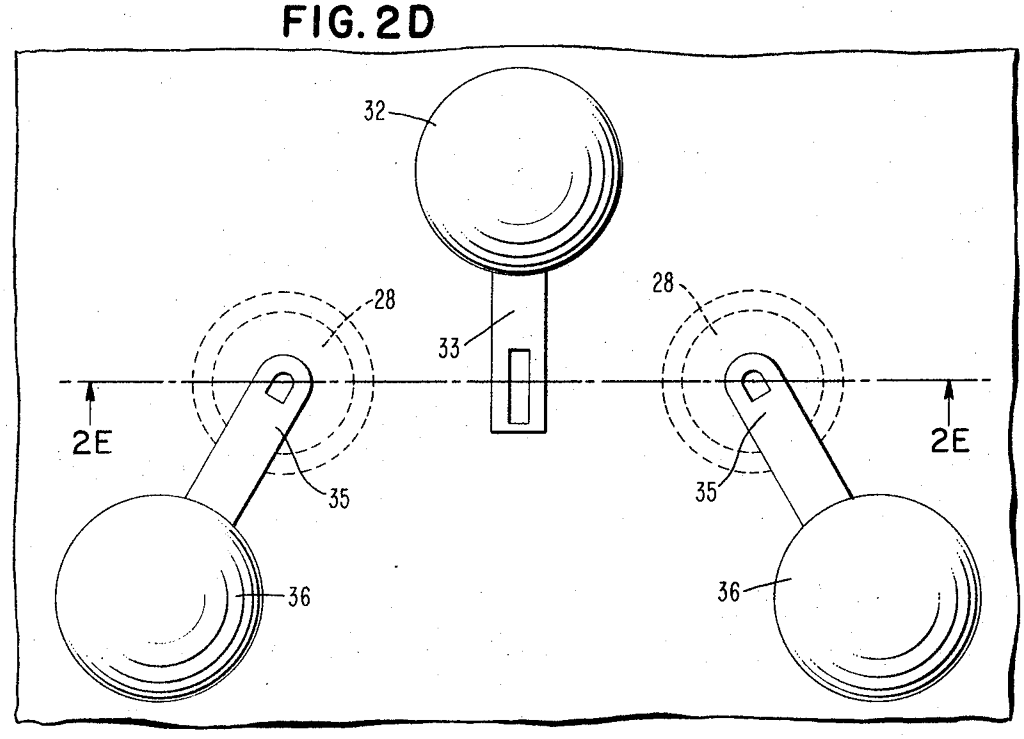
Figure 2E:
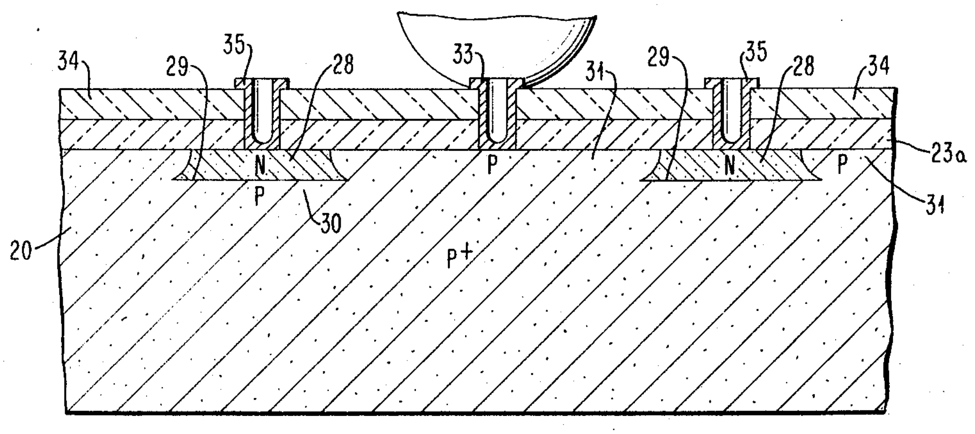

Conventional techniques may be employed in providing terminals and protective coverings for the junctions and the structure of FIG. 2C. It will be manifest that the structure may be suitably severed along a vertical line through the middle to form a pair of semiconductor diodes or that a dual diode having a common body 20 may result. In FIG. 2D there is represented a plan view of a dual diode having a copper ball-type terminal 32 which is suitably bonded to an aluminum strip 33 that is evaporated on and alloyed with the common body 20 of the device as represented in the sectional view of FIG. 2E. The upper surface of the device has a passivating layer **23*a* of silicon dioxide which may be formed by reoxidizing techniques similar to those already described in connection with FIGS. 1A–1C. Layer 23*a* may therefore effectively be a continuation of the layer 23 of FIG. 2C. A glass coating 34 is preferably applied over layer 23*a* such as in the manner disclosed and claimed in the copending application of Jacob Riseman and John Perri, Ser. No. 141,-669, filed Sept. 29, 1961, entitled, "Coated Objects and Methods of Providing the Protective Coverings Therefor," and assigned to the same assignee as the present invention. Known etching techniques were employed in opening suitable holes in the glass coating 34 and the silicon dioxide layer 23*a* over the N-type regions 28, 28 and over the P-type regions 31 so that the strip 33 and the ohmic connections 35, 35** could be evaporated on the exposed semiconductor material as represented in FIG. 2E and over portions of the glass coating as shown in FIG.

2D. Thereafter copper-ball terminals 36, 36 were suitably bonded to the connections 35, 35 simultaneously with the bonding of the ball 32 to the aluminum strip 33.

Figure 3:
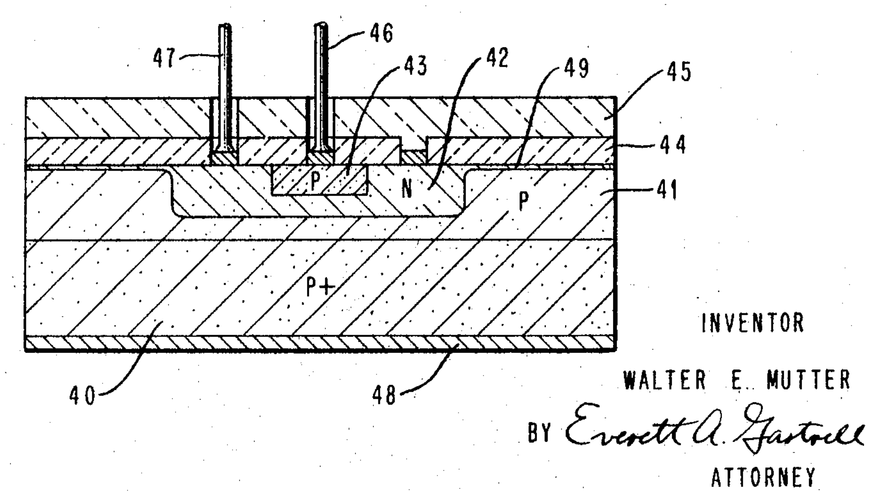
FIG. 3 is a sectional view of a transistor construction in accordance with the prior art.

*Description of prior-art transistor of FIG. 3*

Referring now to FIG. 3 of the drawings, there is represented a prior-art planar transistor of the PNP type which is subjected to inversion-layer problems of the type previously explained. The transistor includes a highly doped semiconductor starting wafer 40 which has a thin high-resistivity P-type epitaxial layer 41 deposited thereon in a conventional manner. The wafer and the layer constitute the collector region of the transistor. Diffused into the layer 41 is an N-type base region 42 which in turn surrounds a diffused P-type emitter region 43. A silicon dioxide film 44 and a glass coating 45 are formed on the upper surface of the planar transistor in the manner previously explained in connection with the dual diode of FIG. 2E. Conventional emitter and base terminals 46 and 47, respectively, extend through openings formed in the film 44 and the coating 45 in a well-known manner to establish electrical connections with the emitter and base regions 43 and 44, respectively. A collector terminal 48 may be established by soldering a metallic plate to the $P^+$ starting wafer 40 or, if desired, may be formed by opening holes (not shown) in the glass coating 45 and the silicon dioxide layer 44 to establish an ohmic contact (not shown) with a portion of the P-type epitaxial layer 41 thereunder, or with that layer and also the wafer.

In the fabrication of the transistor, an undesired N-type inversion layer or skin 49 forms on the P-type epitaxial layer 41 which, as previously mentioned, is prone to inversion because of its high resistivity. This skin effectively has become an extension of the base region 42 so that the collector-base junction no longer extends to the upper surface of the device where it is covered by and protected by the passivating silicon dioxide film 44. Changes in ambient condition now may adversely affect the exposed collector-base junction appearing at the side of the device and unreliable operation may result. The skin 49 forms a channel for collector-to-base leakage currents which are far in excess of what is required for a quality transistor. Such a transistor also undesirably has a low collector-breakdown voltage and a high collector-to-base capacitance, especially at low voltages.

A planar transistor constructed in accordance with the method of the present invention avoids the various disadvantages and limitations of the planar transistor briefly described above.

*Description of transistor structure of FIGS. 4A–4D*

Reference is made to FIGS. 4A–4D which show various stages in the manufacture of an improved planar transistor of the PNP type. It will be understood that the same technique may be employed in making a planar NPN transistor. However, since a high quality planar PNP transistor which is not subject to inversion problems is much more difficult to fabricate than an NPN type, the invention will be described in connection with the former transistor because it has particular utility in that environment. Since the construction of the transistor of FIGS. 4A–4D is generally similar to the dual diode structure of FIGS. 2A–2E, corresponding elements are designated by the same reference numerals in both drawings.

Figure 4A:
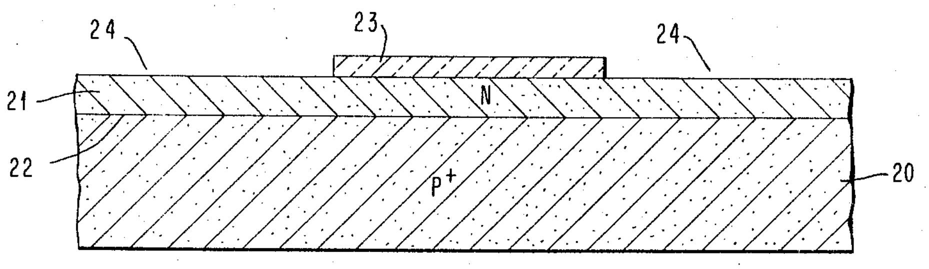
FIGS. 4A–4D are sectional views which are used in explaining the fabrication of a transistor in accordance with the present invention.
Figure 4B:
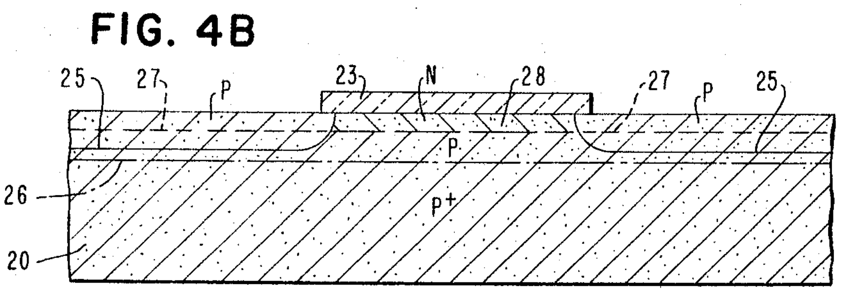

Referring now to FIG. 4A, the low-resistivity body 20 of P-type conductivity silicon has a high-resistivity layer 21 epitaxially deposited thereon, thereby establishing the PN junction 22. An apertured diffusion mask 23 of silicon dioxide is formed on a selected region of the epitaxial layer 21 so that its openings 24, 24 expose predetermined surface areas of that layer. In the manner previously explained, a high concentration of a P-type impurity such as boron is diffused through the openings into the exposed portions of the epitaxial layer 21. As the P-type impurity diffuses inwardly to the extent represented in FIG. 2B by the solid-line saucers 25, 25, the P-type impurity in the heavily doped $P^+$ body 20 is believed to diffuse outwardly from the dash-dot line region 26 which formerly included the PN junction 22. This out-diffusion from the body 20 extends to the region represented by the broken line 27. Again the diffusion time and temperature are selected so that the two diffusions just explained overlap everywhere except in the high-resistivity N-type region 28 just under the silicon dioxide mask 23.

Figure 4C:
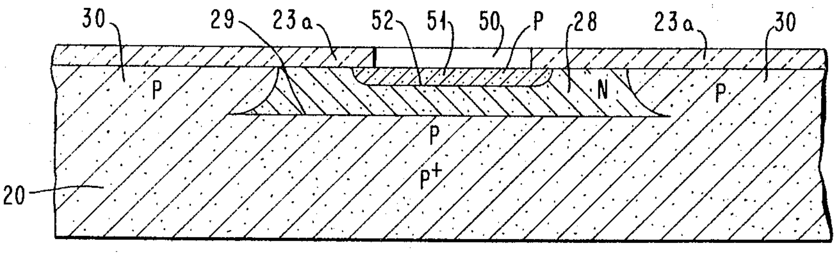
Figure 4D:
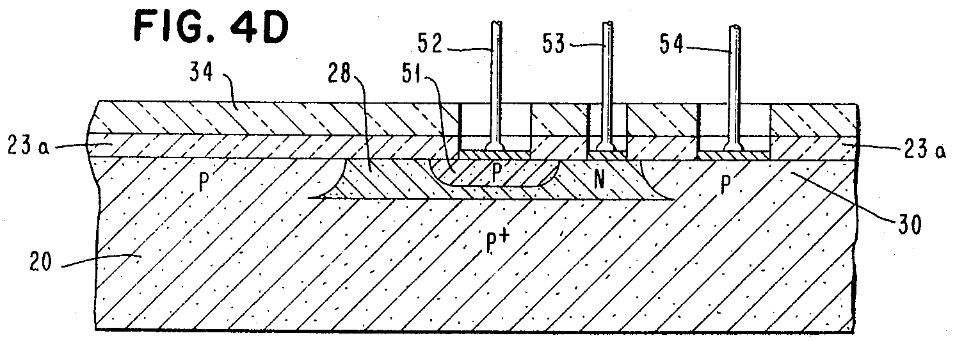

After a subsequent surface reoxidation operation, an aperture 50 is opened in a conventional manner in the central region of the mask 23*a*. This is followed by another boron diffusion which forms the emitter region 51 and the emitter-base junction 52. In this diffusion operation, the time and/or temperature is ordinarily lower than in the previous diffusion so that the desired base widths, for example about 0.04 mil, is realized. The resultant structure is shown in FIG. 4C, which is free from the explanatory construction lines of FIG. 4B. The upper surface of the P-type region 30 is so strongly P, for example, having a concentration of about $10^{20}$ atoms/cm.$^3$ that, from a practical standpoint, inversion will not occur.

The upper surface of the structure is now reoxidized, a glass coating 34 is bonded to the silicon dioxide film 23*a*, apertures are etched in the coating and film to expose portions of the emitter, base and collector regions 51, 28 and 30, respectively, and terminals 52, 53 and 54 are applied to those regions in a conventional manner. The resulting structure is a quality planar PNP transistor which is free from surface inversion problems and yet is relatively inexpensive to fabricate by techniques which are suitable for use in mass production operations.

While the method of the present invention has been explained in connection with the fabrication of a single transistor, it will be apparent that it may be employed in the simultaneous fabrication of a plurality of transistors such as an array thereof made on a common substrate.

While the invention has been particularly shown and described with reference to preferred embodiments thereof, it will be understood by those skilled in the art that the foregoing and other changes in form and details may be made therein without departing from the spirit and scope of the invention.

What is claimed is:

1. The method of inhibiting the formation of an undesired surface inversion region in the fabrication of a semiconductor device comprising:

forming a body of semiconductor material of one conductivity type;

forming a high-resistivity layer of semiconductor material of the opposite conductivity type on a surface of said body; and introducing a conductivity-directing impurity of said one type through at least one selected portion of said layer into said body for converting said portion to said one conductivity type and on a surface region of said portion a concentration of said impurity sufficient to inhibit the inversion of said surface region to said other conductivity type.

2. In the fabrication of a semiconductor device having a semiconductor body of one conductivity type, the method of inhibiting the formation of undesired surface inversion regions in said device comprising:

establishing a layer of semiconductor material of the opposite conductivity type on a surface of said body, said layer having a resistivity in the range of 0.1 to 3 ohm-cm.; and introducing a conductivity-directing impurity of said one type through at least one selected portion of said layer into said body for converting said portion to said one conductivity type and producing on a surface region of said portion a concentration of said impurity between about $10^{19}-5\times10^{20}$ atoms/cm.$^3$ to inhibit the inversion of said surface region to said other conductivity type.

3. The method of inhibiting the formation of an undesired surface inversion region in the fabrication of a semiconductor device comprising:
forming a body of semiconductor material of one conductivity type;
epitaxially depositing a high-resistivity layer of semiconductor material of the opposite conductivity type on a surface of said body, said layer having a resistivity in the range of 0.1 to 3 ohm-cm.; and
diffusing a conductivity-directing impurity of said one type into at least one selected portion of said layer while simultaneously out-diffusing from said body into said selected portion of said layer until said portion is converted to said one conductivity type and on a surface region of said portion a concentration of said impurity sufficient to inhibit the inversion of said surface region to said other conductivity type.

4. The method of inhibiting the formation of an undesired surface inversion region in the fabrication of a semiconductor device comprising:
forming a P-type body of semiconductor material;
vapor depositing a layer of N-type semiconductor material on a surface of said body, said layer having a resistivity in the range of 0.1 to 3 ohm-cm.; and
diffusing a P-type conductivity-directing impurity through at least one selected portion of said layer into said body until said portion is converted to said P conductivity type and producing on a surface region of said portion a concentration of said impurity in the range of $10^{19}-5\times10^{20}$ atoms/cm.$^3$ to inhibit the inversion of said surface region to said N conductivity type and electrically isolate the unselected portions of said layer.

5. The method of inhibiting the formation of an undesired surface inversion region in the fabrication of a semiconductor device comprising:
forming a P-type body of semiconductor material having a resistivity of about 0.01 ohm-cm.;
vapor depositing a layer of N-type semiconductor material having a resistivity of about 0.3 ohm-cm. on a surface of said body; and
diffusing a conductivity-directing impurity of said one type into at least one selected portion of said layer while simultaneously out-diffusing from said body into said selected portion of said layer for converting said portion to said P conductivity type and for producing on a surface region of said portion a concentration of said impurity of about $10^{20}$ atoms/cm.$^3$ to inhibit the inversion of said surface region to said N conductivity type.

6. In the fabrication of a multiple-unit semiconductor diode the method of inhibiting the formation of undesired surface inversion regions comprising:
forming a low-resistivity body of semiconductor material of one conductivity type which is to be electrically common to said units;
vapor depositing a high-resistivity layer of semiconductor material of the opposite conductivity type on a surface of said body;
thermally decomposing a siloxane compound to deposit on said body a silicon oxide coating to serve as a diffusion mask;
forming apertures in selected portions of said mask;
diffusing a conductivity-directing impurity of said one type through said apertures and selected portions of said layer in said body for converting said portions to said one conductivity type and for producing on a surface region of each of said portions a concentration of said impurity sufficient to inhibit the inversion of said surface regions to said other conductivity type;
applying electrical connections to said portions of said high-resistivity layer; and
applying an electrical connection to one of said converted portions of said one conductivity type.

7. The method of inhibiting the formation of an undesired surface inversion region in the fabrication of a semiconductor device comprising:
forming a P-type body of semiconductor material having a resistivity in the range of 0.001–0.03 ohm-cm.;
vapor depositing a layer of N-type semiconductor material having a resistivity in the range of 0.1–3 ohm-cm. on a surface of said body; and
diffusing a conductivity-directing impurity of said one type into at least one selected portion of said layer while simultaneously out-diffusing from said body into said selected portion of said layer for converting said portion to said P conductivity type and for producing on a surface region of said portion a concentration of said impurity in the range of $$10^{19}-5\times10^{20}$$

atoms/cm.$^3$ to inhibit the inversion of said surface region to said N conductivity type.

8. In the method for fabrication of a multiple-unit silicon semiconductor diode comprising:
forming a low-resistivity body of semiconductor material of one conductivity type which is to be electrically common to said units;
vapor depositing a high-resistivity layer of silicon semiconductor material of the opposite conductivity type on a surface of said body;
heating said layer in an oxidizing atmosphere to deposit on said layer a silicon oxide coating to serve as a diffusion mask;
forming apertures in selected portions of said mask;
diffusing a conductivity-directing impurity of said one type through said apertures and selected portions of said layer into said body for converting said portions to said one conductivity type and for producing on a surface region of each of said portions a concentration of said impurity sufficient to inhibit the inversion of said surface regions to said other conductivity type and electrically isolate the unselected portions of said high resistivity layer;
applying electrical connections to said portions of said high-resistivity layer; and
applying an electrical connection to one of said converted portions of said one conductivity type.

9. In the method for fabrication of multiple semiconductor devices comprising:
forming a body of semiconductor material of one conductivity type;
vapor depositing a high-resistivity layer of semiconductor material of the opposite conductivity type on a surface of said body;
forming on said layer a coating to serve as a diffusion mask;
forming apertures in selected portions of said mask;
diffusing a conductivity-directing impurity of said one type through said apertures and selected portions of said layer while simultaneously out-diffusing from said body into said at least one selected portion of said layer until said portions are converted to said one conductivity type and there is produced on a surface region of each of said portions a concentration of said impurity sufficient to inhibit the inversion of said surface regions to said other conductivity type and electrically isolate the unselected portions of said high-resistivity layer;
applying electrical connections to said portions of said high-resistivity layer; and
applying an electrical connection to one of said converted portions of said one conductivity type.

10. In the method for fabrication of multiple semiconductor devices of claim 9 further comprising forming a PN junction in at least one of said portions of said high-resistivity layer.

11. In the method for fabrication of multiple semiconductor devices comprising:

forming a P-type body of semiconductor material;

vapor depositing a layer of N-type semiconductor material on a surface of said body;

said layer having a resistivity in the range of 0.1 to 3 ohm-cm;

forming on said layer a coating to serve as a diffusion mask;

forming apertures in selected portions of said mask;

diffusing a conductivity-directing impurity of P-type through said apertures and selected portions of said layer into said body for converting said portions to P conductivity type and for producing on a surface region of each of said portions a concentration of said impurity in the range of $10^{19}-5\times10^{20}$ atoms/cm.$^3$ to inhibit the inversion of said surface regions to said N conductivity type and electrically isolate the unselected portions of said layer;

applying electrical connections to said portions of said layer; and applying an electrical connection to one of said converted portions of said P-type body.

12. In the method for fabrication of multiple semiconductor devices of claim 11 wherein said semiconductor material is silicon and said coating is formed by heating said layer in an oxidizing atmosphere to form a silicon dioxide coating to serve as a diffusion mask.

References Cited by the Examiner

UNITED STATES PATENTS

| | | | |
|---|---|---|---|
| 2,804,405 | 8/1957 | Derick | 148—188 X |
| 2,816,847 | 12/1957 | Shockley | 148—188 |
| 2,841,510 | 7/1958 | Mayer | 148—188 X |
| 2,985,805 | 5/1961 | Nelson | 148—188 X |
| 2,989,805 | 6/1961 | Rutz | 148—189 X |
| 3,155,551 | 11/1964 | Bennett | 148—191 |
| 3,156,591 | 11/1964 | Hale. | |
| 3,164,498 | 1/1965 | Loeb | 148—189 X |
| 3,178,798 | 4/1965 | Marinace | 148—175 X |
| 3,183,128 | 5/1965 | Leistiko et al. | 148—191 X |
| 3,183,129 | 5/1965 | Tripp | 148—187 X |
| 3,211,971 | 10/1965 | Barson | 148—178 X |
| 3,226,611 | 12/1965 | Haenichen | 148—30.5 X |
| 3,226,612 | 12/1965 | Haenichen | 148—186 X |
| 3,226,613 | 12/1965 | Haenichen | 148—33 X |

References Cited by the Applicant

UNITED STATES PATENTS

| | | |
|---|---|---|
| 3,089,794 | 5/1963 | Marinace. |
| 3,150,299 | 9/1964 | Noyce. |
| 3,197,681 | 7/1965 | Broussard. |

FOREIGN PATENTS

| | | |
|---|---|---|
| 1,262,176 | 4/1961 | France. |
| 1,282,020 | 12/1961 | France. |

HYLAND BIZOT, *Primary Examiner.*